United States Patent [19]

Kasai et al.

[11] Patent Number: 4,953,219

[45] Date of Patent: Aug. 28, 1990

[54] STEREO SIGNAL REPRODUCING SYSTEM USING REVERB UNIT

[75] Inventors: Junichi Kasai; Wataru Yagihashi, both of Kanagawa, Japan

[73] Assignee: Nissan Motor Company Limited, Yokohama, Japan

[21] Appl. No.: 194,937

[22] Filed: May 17, 1988

[30] Foreign Application Priority Data

Jun. 26, 1987 [JP] Japan ................................ 62-158887

[51] Int. Cl.[5] .......................... H04B 1/00; H03G 3/00

[52] U.S. Cl. .......................................... 381/86; 381/63

[58] Field of Search .......................... 381/63, 86, 17, 1

[56] References Cited

U.S. PATENT DOCUMENTS

| | | | |
|---|---|---|---|
| 4,005,268 | 1/1977 | Canell et al. | 381/63 |
| 4,237,343 | 12/1980 | Kurtin et al. | 381/63 |
| 4,329,544 | 5/1982 | Yamada | 381/63 |
| 4,338,581 | 7/1982 | Morgan | 381/63 |
| 4,694,497 | 9/1987 | Kasai et al. | 381/63 |

OTHER PUBLICATIONS

"Improvement of Audo Sound Field within Car Interior*", Imai et al, Jul. 1987, pp. 50-55.

*Primary Examiner*—Forester W. Isen

*Attorney, Agent, or Firm*—Foley & Lardner, Schwartz, Jeffery, Schwaab, Mack, Blumenthal & Evans

[57] ABSTRACT

A system for reproducing stereophonic sound signals to create an appropriate audio sound ambience in various compartments having different reverberation characteristics. The system includes a right-hand loudspeaker for producing a right-channel sound signal, left-hand loudspeaker for producing a left-channel sound signal, and a center loudspeaker for producing a signal derived from a combination of right and left signals. The center loudspeaker generates a sound output of a signal having a predetermined lag time relative to that of the right- and left-speakers to create the suitable audio ambience effect for a listener in accordance with the reverberation characteristics of the compartment.

13 Claims, 5 Drawing Sheets

A: DRY SIGNAL (NON DELAYED SIGNAL)
B: DELAYED SIGNAL

STEREO SIGNAL REPRODUCING SYSTEM USING REVERB UNIT

BACKGROUND OF THE INVENTION

The present invention relates generally to a system for acoustical reproduction of stereophonic signals and, more particularly, to a stereo signal reproducing system provided with delay unit for simulating the effect of acoustic reverberation.

With respect to conventional audio ambience simulation system, Japanese Patent Application (tokugansho) No. 59-237946 exemplifies such a system. The system comprises reproduction apparatuses and a delay circuit. One apparatus reproduces a signal output by a sound signal source, such as a disc record player, or so forth, while another apparatus delays the same signal by means of the delay circuit. The delayed signal is added to the signal without any delay (this will be referred as "dry signal"). The delay time is set within the range of 0.5msec. to 50msec. The system thus provides a signal which simulates the effect of acoustic reverberation so as to enhance the original signal output of the stereo. Acoustical ambience effect can thus be improved.

Such conventional systems, however, merely add a delayed signal which has a delay time in the range from 0.5msec. to 50msec. to a dry signal without regard to the reverberation characteristics of the listening chamber, because the acoustical properties of the chamber are not usually known. Therefore, even if the delay setting produces the optimum effect in a chamber having a certain set of acoustical properties, the same delay setting may provide an undesirable effect in another chamber having different acoustic qualities.

In practice, a delayed sound reaches the listener after the level of the natural reveberation from dry sound is reduced below a level required for acoustic ambience effect to be generated and thereby an acoustic separation of the delayed sound and the dry sound is caused. Since vehicular cabins have greatly different reverberation characteristics compared to most other normal audio chambers, such acoustic separation tends to occur in vehicular cabins especially. For these reasons, a system which creates an appropriate stereophonic sound ambience is sought.

SUMMARY OF THE INVENTION

It is an object of the present invention to provide an automotive audio system which satisfies the demand for higher quality audio sound and better ambience.

It is another object of the present invention to provide an automotive audio system which always creates appropriate stereophonic ambience in a vehicular compartment regardless of variations of reverberation characteristics due to the size of the compartment, the number of passengers, and so forth.

According to one aspect of the present invention, there is provided a stereo signal reproducing system in a vehicular cabin comprising a reproducing apparatus for directly reproducing a sound in accordance with a signal output by a signal source and reproducing a delayed sound delayed by a predetermined period of time after the directly reproduced sound.

According to another aspect of the invention, there is provided a stereo signal reproducing system disposed within a compartment having a reverberation time comprising an audio signal source adapted to generate audio outputs for reproduction, a first audio signal path, connected with the signal source to receive the audio signal, for providing an audio output to the compartment, a second audio signal path, connected with the source to receive the audio signal, for providing a delayed audio output so as to generate an audio ambience effect in cooperation with the non delayed audio output of the first path; and a reverberation unit, associated with the second path, for delaying the audio signal in the second path compared to the audio output of the first path by a period of time determined on the basis of the reverberation time.

According to still another aspect of the invention, there is provided an automotive audio system provided within a vehicular cabin having a variable reverberation time due to changing of conditions therein comprising an audio signal source adapted to generate audio outputs for reproduction, a first audio signal path, connected with the signal source to receive the audio signal, for providing an audio output to the compartment, a second audio signal path, connected with the source to receive the audio signal, for providing a delayed audio output so as to generate an audio ambience effect in cooperation with the non delayed audio output of the first path, and a unit, associated with the second path, for delaying the audio signal in the second path compared to the audio output of the first path by a period of time selectively determined in a predetermined range in accordance with variation of the reverberation time to generate an ambience effect.

According to a further aspect of the invention, there is provided a stereo signal reproducing system, provided within a vehicular cabin which has a variable reverberation time T, for generating an ambience effect comprising an audio signal source adapted to generate audio outputs for reproduction, a first audio signal path, connected with the audio signal source, for applying the audio signal generated by the signal source to a first loudspeaker to reproduce the audio signal, a second audio signal path, connected with the audio signal source, for applying the audio signal generated by the signal source to a second loudspeaker to produce an ambience effect in cooperation with the audio output generated by the first loudspeaker, a reverberation time measuring unit for measuring a reverberation time T which varies in accordance with changing of conditions in the vehicular cabin, and a reverberation unit, interposed within the second signal path, for imposing a lag time t which is determined in accordance with variation of the reverberation time T measured by the measuring unit on the audio signal provided within the second signal path to generate an audio output by means of the second loudspeaker delayed relative to the audio output from the first loudspeaker to create optimal reverberation.

According to a still further aspect of the invention, there is provided a stereo signal reproducing system provided within a compartment for generating an ambience effect comprising an audio signal source adapted to generate a right-channel and left-channel audio outputs for reproduction, a right speaker for reproducing the right- channel audio signal generated by the signal source, a left speaker for reproducing the left- channel audio signal generated by the signal source to produce stereophonic sound image in cooperation with the right speaker, a center speaker, centrally disposed between the right and left speaker, for reproducing a signal derived from a combination of the right- and left-channel audio signals, a reverberation time meter for measuring a reverberation time T provided in the compartment which varies in accordance with compartment conditions, and a unit, associated with the meter, for receiving the right- and left-channel audio signals, the unit imposing a lag time on the received signals which lag time is adjusted on the basis of the reverberation time T measured by the meter and applying it to the center speaker so that the sound output of the center speaker in cooperation with the right and left speakers respectively generates an ambience effect.

DETAILED DESCRIPTION OF THE INVENTION

Figure 1:
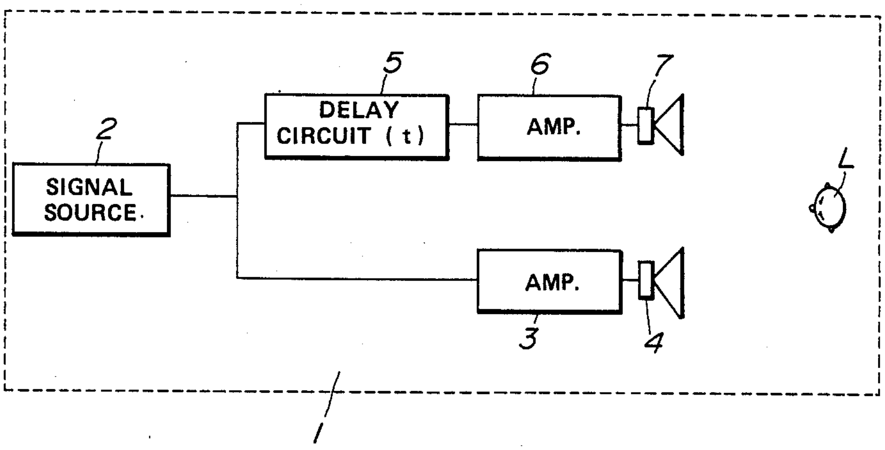
FIG. 1 is a schematic block diagram of the stereo signal reproduction device according to the present invention.
Figure 2:
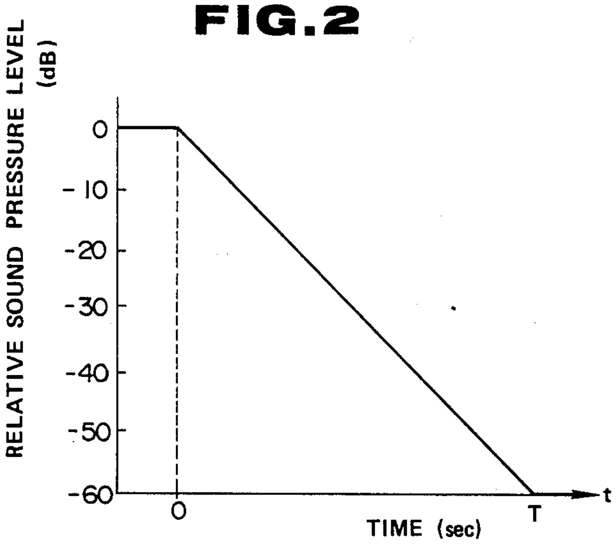
FIG. 2 is a graph which represents reverberation characteristics of a compartment.

Referring now to the drawings, wherein like numerals refer to like parts in the several views, and in particular to FIG. 1, there is illustrated a compartment 1. The compartment 1 comprises a first audio signal path and a second audio signal path. The first path includes a signal source 2, such as a disk record player, a cassette tape player, a CD player, a radio tuner, or so forth, a first amplifier 3 for amplifying a signal generated from the source 2, and a first loudspeaker 4. The second path includes the signal source 2, a delay circuit 5, a second amplifier 6 for amplifying the delayed signal output by the delay circuit, and a second loudspeaker 7 for reproducing the signal from the amplifier 6. These first and second loudspeakers 4 and 7 are positioned in front of a listener L. The delay circuit 5 imposes a lag time t on an audio signal output by the source 2. The provided lag time t is set so as to satisfy the following formula:

$$t \leqq \frac{T}{10}$$

wherein T is reverberation time which is the time required for sound to die away to one-thousandth of its initial pressure, that is, to drop 60 decibels (dB) in sound-pressure level and has characteristics as shown in FIG. 2.

As is well known, when identical sounds separated by a short lag time reach a listener from different directions, the listener will hear the sound as being produced from the speaker from which the sound emanates first, meaning that the listener will feel the illusion that the sound source is in the direction of the earlier sound. This is well known in the art as the "harness effect". Also, it is well known that the apparent distance from the sound source is significantly influenced by the presence of delayed sound or reverberation. In particular, reverberation causes the sound source to appear to be further than its actual distance. Therefore, by inducing an appropriate degree of lag and reverberation in the reproduced audio output the quality of the reproduced sound and the audio ambience can be improved. The above delay circuit 5 functions as a reverb unit which generates the "harness effect".

FIG. 2 shows reverberation time T characteristics. The ordinate axis indicates the relative sound pressure level (dB). The abscissa axis indicates time passed from stop of the sound generation indicated by zero. For example, when the size of the compartment 1 is about 16.2 $m^2$, the time T is about 350msec.

In order to obtain the above formula, a first experiment in a compartment 1 shown in FIG. 1 and a vehicular compartment 11 shown in FIG. 4, as set forth in the below illustrated table, were performed. In the first experiment, a listener L was positioned in the front of loudspeakers 4 and 7 in the compartment 1 wherein the reverberation time T is 350msec. While the lag time t of a delay circuit 5 was varied in the range of 0.5msec to 50.0msec, the listener L was asked to analyze sound created by the speakers 4 and 7. The results of the experiments are shown in the table below, wherein the EFFECT A means that the listener L felt that the ambience effect of the sound resembled that of sound produced in a large chamber. The EFFECT B means that the listener L felt that the sound image appeared unbalanced. Unbalanced in this case meaning that the dry sound from loudspeaker 4 and the delayed sound output by delay circuit 5 and reproduced by the loudspeaker 7 appear to be separate.

TABLE

| | IN COMPARTMENT 1 | | IN THE VEHICULAR COMPARTMENT | |
|---|---|---|---|---|
| tmsec. | EFFECT A | EFFECT B | EFFECT A | EFFECT B |
| 0.5 | n | b | n | b |
| 1.0 | n | b | n | b |
| 5.0 | n | b | n | b |
| 10.0 | n | b | yn | b |
| 15.0 | yn | b | y | b |
| 20.0 | y | b | y | b |
| 25.0 | y | b | y | bs |
| 30.0 | y | b | y | s |
| 35.0 | y | bs | n | s |
| 40.0 | n | s | n | s |
| 45.0 | n | s | n | s |
| 50.0 | n | s | n | s |

Where
y yes
yn somewhat
n no
b balanced
bs slightly unbalanced
s separated

As can be seen the results of the first experiment shown in the above table, a lag time t in the range of 15msec. to 35msec. produced the best results, thus indicating that the lag time t which creates an improved acoustical ambience effect can be determined by the formula $$t \leqq \frac{T}{10}.$$

Figure 3:
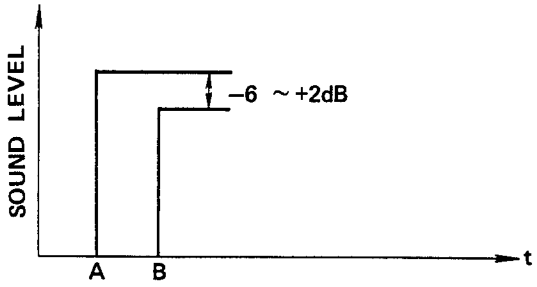
FIG. 3 is a graph which represents a difference of sound level causing "harness effect".

With respect to sound level difference between sound level of the direct signal output by the loudspeaker 4 and that delayed by the delay circuit 5 and reproduced by the loudspeaker 7 which difference influences the harness effect, a second experiment was performed. FIG. 3 shows the sound level difference which produces the best acoustical ambience effect. In the second experiment, a dry sound was output from the loudspeaker 4 without any delay and a delayed sound was output from the loudspeaker 7 in the compartment 1 which had a reverberation time T. The experiment showed that when volume of the delayed sound level compared to the dry sound without any delay is in the range of −6dB to +2dB, a suitable stereophonic sound image is produced. This results in a greatly improved acoustical effect and stereophonic sound quality. It will be appreciated that the delayed sound is produced from the loudspeaker 7 when the dry sound level from the loudspeaker 4 is reduced −6dB or less, the harness effect that a sound image is located in a direction of origin of the sound which comes to a listener earlier does not occur. As a result, the delayed sound and the dry sound are heard from different apparent directions.

It will to be noted that when the delayed sound is superimposed on the dry sound before decreasing of the dry sound level to −6db or less, the stereophonic ambience effect is improved. In the second experiment, similar to the first experiment, it was established that the delay time t can be determined in accordance with the reverberation time T and given by the following formula, $$t \leqq \frac{T}{10}$$

Consequently, by setting the lag time t of the delay circuit 5 to satisfy the formula $$t \leqq \frac{T}{10},$$

the stereophonic sound ambience effect can be greatly improved.

Figure 4:
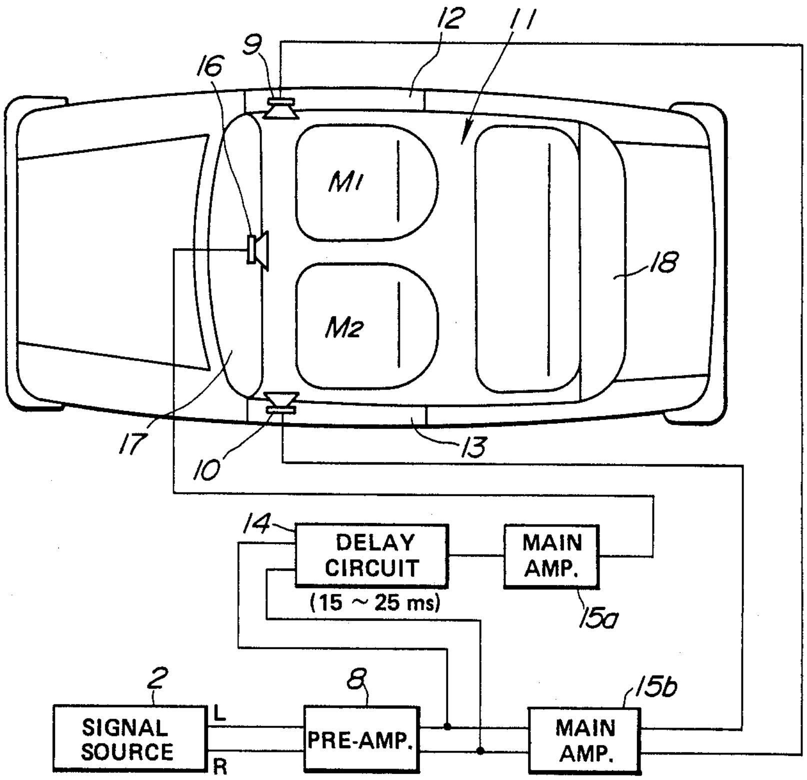
FIG. 4 is a schematic diagram of a first embodiment of an automotive audio system according to the invention.

FIG. 4 shows a first embodiment according to the invention. While the system is basically the same as the system shown in FIG. 1, a right-hand loudspeaker 9 for reproducing right-channel (R-channel) audio sound and a left-hand loudspeaker 10 for reproducing left-channel (L-channel) audio sound from a signal source 20 are provided therein. The loudspeaker 9 and the loudspeaker 10 are installed in the front of front doors 12 and 13 respectively in a vehicular compartment 11. A center loudspeaker 16 is centrally mounted on an instrument panel 17 to be positioned at an equal distance from passengers $M_1$ and $M_2$. In the arrangement, audio images can be localized relative to each passengers' seat to obtain a stereophonic sound ambience effect.

A delay circuit 14 is connected between a pre-amplifier 8 and a main amplifier 15*a*. The delay circuit 14 receives a L-channel sound signal and a R-channel sound signal from the source 2 through the pre-amplifier 8. The received signals are then mixed and fed to the delay unit which provide a delay time t the output of the delay unit is then amplified by a main amplifier 15*a* and fed to the center loudspeaker 16. The loudspeakers 9 and 10 receive a R-channel signal and a L-channel signal directly through the pre-amplifier 8 and a main amplifier 15*b* respectively without any delay.

In the compartment 11, the reverberation time T is about 200msec. As shown in the right column of above table, the experiment results indicate that when a lag time t is set within the range of 15msec. to 25msec., a suitable stereophonic sound ambience effect can be achieved. It will be noted that the delay time t can be determined to satisfy the same formula as the first experiment given as:

$$t \leqq \frac{T}{10}$$

In the arrangement shown in FIG. 4, the center loudspeaker 16 reproduces a signal derived from a combination of the the R-channel and L-channel signals. The passenger $M_1$ can listen to symmetrically balanced sound reproduced by the loudspeaker 9 and 16 and the passenger $M_2$ can listen to a similar sound produced by the loudspeakers 16 and 10.

Moreover, it is possible that a delayed L-channel signal may be added to the dry R-channel signal to be reproduced by the right loudspeaker 9 and a delayed R-channel signal be added to the dry L-channel signal to be reproduced by the left loudspeaker 10 and the center loudspeaker 16 be omitted. In doing so, a reverberation effect may be obtained that is similar to the effect obtained with the construction using the center loudspeaker 16 for reproducing delayed R- and L-channel signal.

The arrangement of loudspeakers of the present invention is not limited to the above. For example, R-channel and L-channel loudspeakers for passengers seated in the rear seat may be further provided at right and left on the rear parcel shelf 18 respectively and a center speaker for producing delayed sound may be positioned at center of the R- and L-channel loudspeakers. With this the arrangement, the passengers seated in the rear seat can hear stereophonic sound with an ambience effect similar to the passengers $M_1$ and $M_2$ seated in the front seats.

Various modifications can be made to the system. The U.S. Pat. No. 4,694,497 discloses various arrangements of speaker systems applicable to this invention. The contents of this patent are hereby incorporated by reference.

Figure 5:
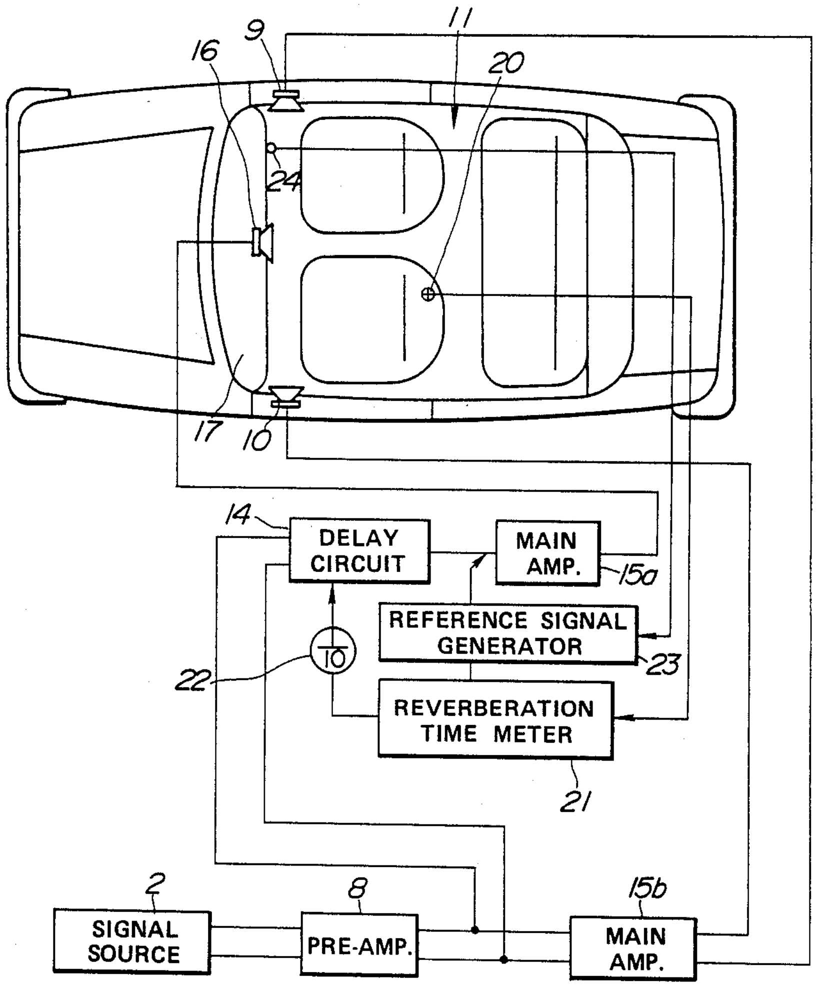
FIG. 5 is a schematic diagram of a second embodiment of the audio system according to the invention.

Referring to FIG. 5, there is illustrated a second embodiment of the present invention which employs a microphone 20 for measuring the level of sound propagated into the vehicular compartment. The microphone 20 is located, for example, on a passengers' seat and detects a sound reproduced in the compartment 11 for providing a output signal indicative of reproduced sound level to a reverberation time meter 21 disposed within a reproduction circuit. The meter 21 measures the time of attenuation of a sound reproduced in the compartment 11 to obtain the actual reverberation time therein and outputs a signal representative of the reverberation time measured therein to the delay circuit 14 through a divider 22. A hand-operated reference signal generator 23 is provided for the reverberation time meter 21. The generator 23 has a switch 24 installed at, for example, an instrument panel in front of the driver. Turning on the switch 24, the generator 23 outputs a reference signal to a main amplifier 15*a*.

The presence of passengers in the compartment 11 can cause the reverberation time to vary. Assuming that the number of the passengers is increased or decreased, the switch 24 is turned on to output the reference signal to the amplifier 15. The center loudspeaker 16 reproduces the reference signal applied from the amplifier 15. The microphone 20 receives the sound propagated into the compartment 11 which is corresponding to the reference signal. The reverberation time meter 21 compares the original reference signal applied from the reference signal generator 23 with a true signal detected by the microphone 20 to obtain the actual reverberation time T of the compartment 11. Thereafter, the divider 22 provides an output signal representative of a value that is one-tenth the actual reverberation time T measured by the meter 21 to the delay circuit 14, thereby causing the lag time t of the delay circuit 14 to be set. As a result, the relationship between lag time t and the reverberation time T can be always maintained in the range of $$t \leq \frac{T}{10}$$

regardless of the change of the reverberation time T conditions due to the presence of passengers in the compartment 11.

Figure 6:
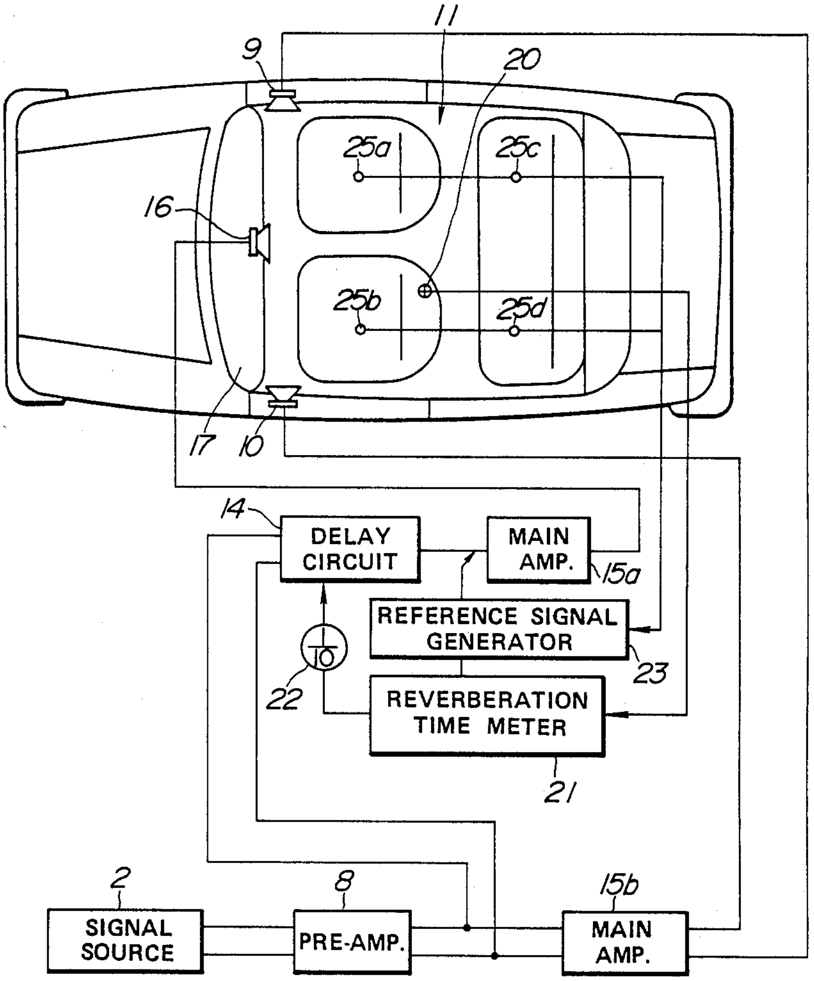
FIG. 6 is a schematic diagram of a modified form of the second embodiment.

Referring to FIG. 6, there is illustrated a modified form of the second embodiment. The construction of reproduction circuit is the same as that of second embodiment except for seat sensors 25a, 25b, 25c, and 25d which are provided instead of the switch 24.

The seat sensors 25a, 25b, 25c, and 25d are installed in respective passengers' seats in a vehicular compartment and function as switches for driving a reference signal generator 23. The sensor responds to the presence of the passengers to activate a reference signal generator 23. The generator 23 applies a reference signal to an amplifier and a speaker reproduces it in the compartment. The reproduced sound is detected by a microphone 20 and, on the basis of the detected sound in the compartment, the reverberation time meter 21 measures the actual reverberation time in the compartment which may vary due to the presence of the passengers. It will be appreciated that when the number of passengers increases or decreases, the actual reverberation time in the compartment is automatically measured and optimal reverberation is created to obtain ambient effects in the same manner of the second embodiment.

In the above arrangement using seat sensors, reverberation time selecting means for selecting predetermined optimal reverberation time in response to a condition indicated by the seat sensors may be provided instead of the microphone 20, the reference signal generator 23, and the reverberation time meter 21.

Figure 7:
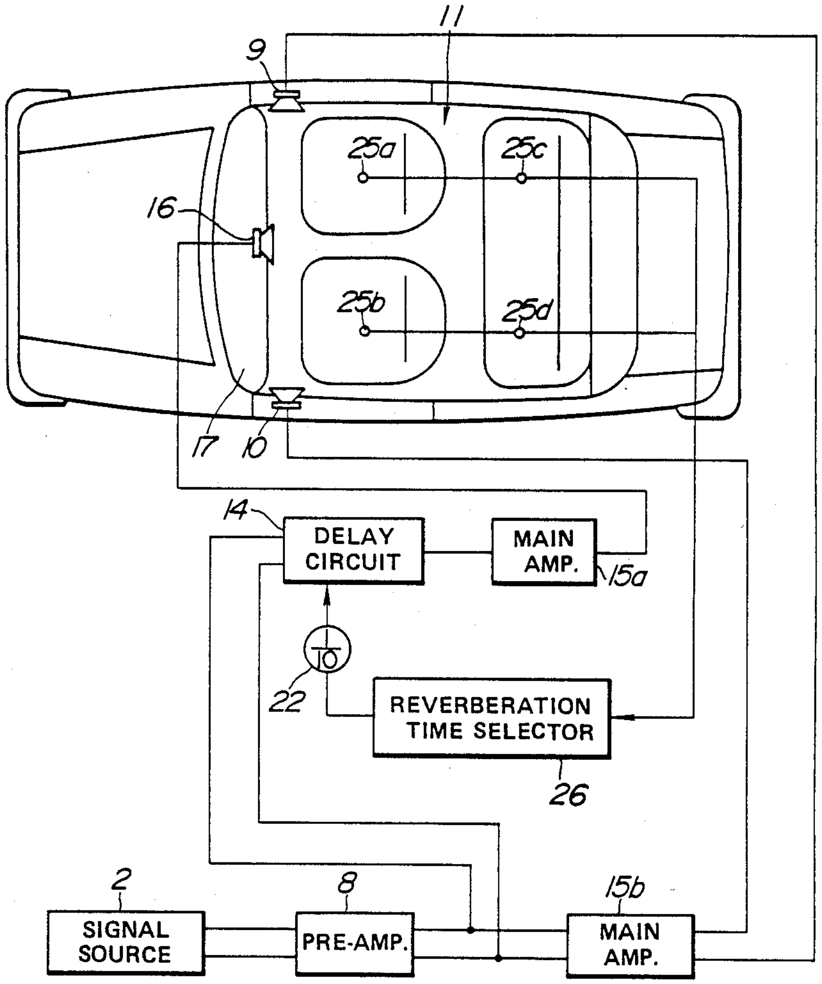
FIG. 7 is a schematic diagram of a modified form of the embodiment shown in FIG. 6.

FIG. 7 shows a reproduction circuit using the reverberation time selecting means. Construction of the circuit is basically the same as that shown in FIG. 6. For the sake of simplicity, the description of only the reverberation time selecting means will be described hereinbelow. In this arrangement, a reverberation time selector 26 is connected with seat sensors installed on passengers' seats. The selector 26 provides a predetermined reverberation time selectively to a divider 22 in accordance with the sensed number of passengers indicated by the seat sensor. Therefore, by determining the suitable reverberation time relative to the number of the passengers in a vehicle cabin in advance, optimal reverberation time can be obtained when the number of the passengers is varied, and thereby the optimum acoustical ambience effect may be easily generated.

Although the present invention has been described in connection with a vehicular compartment, as can be seen from the above mentioned experiment, it is to be noted that it is not limited to such an application and is applicable to other compartments such as a listening room. Moreover, in the first and second embodiment, the loudspeakers 9 and 10 are positioned each front side of the front doors only. Loudspeakers having R-channel and L-channel respectively are however symmetricaly mounted on a rear parcel shelf and a loudspeaker for producing a delayed audio signal relative to that of the respective loudspeakers for passengers seated in a rear seat can be centrally mounted on the parcel shelf.

What is claimed is:

1. An automotive audio system provided within a vehicular cabin having a variable reverberation time due to changing conditions therein comprising;

an audio signal source adapted to generate audio outputs for reproduction;

a first audio signal path, connected with said signal source to receive said audio signal, for providing an audio output to the vehicular cabin;

a second audio signal path, connected with said source to receive said audio signal, for providing a delayed audio output so as to generate an audio ambience effect in cooperation with said non delayed audio output of the first path;

measuring means for measuring a reverberation time within said vehicular cabin; and delaying means, associated with said second path, for delaying the audio signal in the second path compared to the audio output of said first path by a period of time determined within said vehicular cabin as measured by said measuring means to generate an ambience effect.

2. A system as set forth in claim 1, wherein said predetermined range is approximately one-tenth of reverberation time or less.

3. An automotive audio system provided within a vehicular cabin having a variable reverberation time due to changing of conditions therein comprising:

an audio signal source adapted to generate audio outputs for reproduction;

a first audio signal path, connected with said signal source to receive said audio signal, for providing an audio output to the vehicular cabin;

a second audio signal path, connected with said source to receive said audio signal, for providing a delayed audio output so as to generate an audio ambience effect in cooperation with said non delayed audio output of the first path; and means, associated with said second path, for delaying the audio signal in the second path compared to the audio output of said first path by a period of time selectively determined in a predetermined range to generate an ambience effect;

said means includes a plurality of seat sensors mounted on respective seats disposed within said vehicular cabin, said sensors detecting the presence of occupants in the seats and providing information indicative of the number of occupants in the cabin to said means for determining said delay time in accordance with the sensed number of occupants.

4. A stereo signal reproducing system provided within a compartment having a reverberation time comprising;

an audio signal source adapted to generate audio outputs for reproduction;

a first audio signal path, connected with said signal source to receive said audio signal, for providing an audio output to the compartment;

a second audio signal path, connected with said source to receive said audio signal, for providing a delayed audio output so as to generate an audio ambience effect in cooperation with said non delayed audio output of the first path;

measuring means for measuring a reverberation time within the compartment; and delaying means, associated with said second path, for delaying the audio signal in the second path compared to the audio output of said first path by a period of time defined in accordance with the reverberation time measured by said measuring means to generate an audio ambience effect.

5. A system as set forth in claim 4, wherein said period of time is approximately one-tenth or less of the reverberation time within said compartment as measured by said measuring means.

6. A stereo signal reproducing system provided within a compartment for generating an ambience effect comprising:

an audio signal source adapted to generate a right-channel and left-channel audio outputs for reproduction;

a right speaker for reproducing the right-channel audio signal generated by said signal source;

a left speaker for reproducing the left-channel audio signal generated by said signal source to produce stereophonic sound image in cooperation with said right speaker;

a center speaker, centrally disposed between said right and left speaker, for reproducing a signal derived from a combination of the right- and left-channel audio signals;

a reverberation time meter for measuring a reverberation time T provided in said compartment which varies in accordance with compartment conditions; and means, associated with said meter, for receiving the right- and left-channel audio signals, said means imposing a lag time on said received signals which lag time is adjusted on the basis of the reverberation time T measured by said meter and applying it to said center speaker so that the sound output of the center speaker in cooperation with said right and left speakers respectively generates an ambience effect.

7. A system as set forth in claim 6 wherein said reverberation time meter includes a generator for generating the sound having a predetermined frequency, a microphone for detecting said sound, a measuring section for measuring reverberation time T.

8. A system as set forth in claim 6, wherein said lag time t is adjusted with respect to said measured reverberation time T so as to satisfy the following formula:

$$t \leqq \frac{T}{10}$$

9. A stereo signal reproducing system, provided within a vehicular cabin which has a variable reverberation time T, for generating an ambience effect comprising:

an audio signal source adapted to generate audio outputs for reproduction;

a first audio signal path, connected with said audio signal source, for applying the audio signal generated by said signal source to a first loudspeaker to reproduce said audio signal;

a second audio signal path, connected with said audio signal source, for applying the audio signal generated by said signal source to a second loudspeaker to produce an ambience effect in cooperation with the audio output generated by said first loudspeaker;

reverberation time measuring means for measuring a reverberation time T which varies in accordance with changing of conditions in said vehicular cabin; and reverberation means, interposed within said second signal path, for imposing a lag time t which is determined in accordance with variation of the reverberation time T measured by said measuring means on said audio signal provided within said second signal path to generate an audio output by means of the second loudspeaker delayed relative to the audio output from the first loudspeaker to create optimal reverberation.

10. A system as set forth in claim 9, wherein said lag time t is given by the following formula:

$$t \leqq \frac{T}{10}$$

11. A system as set forth in claim 9, wherein reverberation time measuring means further comprises a reference signal generator for generating a reference sound signal having a predetermined frequency to be reproduced by one of said loudspeakers, detection means for detecting the sound reproduced by said loudspeaker, and measuring section for measuring the reverberation time T in the vehicular cabin according to said detected sound.

12. A system as set forth in claim 9, further comprising a hand-operated switch for operating said reverberation time measuring means.

13. A system as set forth in claim 9, further comprising a plurality of seat sensors, mounted on respective seats, for operating said reverberation time measuring means in response to the presence of the passenger seated in the seat in the vehicular cabin.

* * * * *